(12) United States Patent
Jeng et al.

(10) Patent No.: US 9,443,806 B2
(45) Date of Patent: Sep. 13, 2016

(54) CHIP PACKAGES AND METHODS OF MANUFACTURING THE SAME

(71) Applicant: Taiwan Semiconductor Manufacturing Company, Ltd., Hsin-Chu (TW)

(72) Inventors: Shin-Puu Jeng, Hsin-Chu (TW); Cheng-Chieh Hsieh, Tainan County (TW); Tsung-Shu Lin, New Taipei (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/491,507

(22) Filed: Sep. 19, 2014

(65) Prior Publication Data

US 2015/0325536 A1 Nov. 12, 2015

Related U.S. Application Data

(60) Provisional application No. 61/991,316, filed on May 9, 2014.

(51) Int. Cl.
| | |
|---|---|
| *H01L 23/48* | (2006.01) |
| *H01L 23/538* | (2006.01) |
| *H01L 23/00* | (2006.01) |
| *H01L 21/283* | (2006.01) |
| *H01L 23/31* | (2006.01) |
| *H01L 23/498* | (2006.01) |

(52) U.S. Cl.
CPC ......... *H01L 23/5389* (2013.01); *H01L 21/283* (2013.01); *H01L 23/00* (2013.01); *H01L 23/3192* (2013.01); *H01L 23/481* (2013.01); *H01L 23/5383* (2013.01); *H01L 23/5384* (2013.01); *H01L 24/03* (2013.01); *H01L 24/05* (2013.01); *H01L 24/18* (2013.01); *H01L 23/49816* (2013.01); *H01L 2224/0231* (2013.01); *H01L 2224/02379* (2013.01); *H01L 2224/18* (2013.01)

(58) Field of Classification Search
None
See application file for complete search history.

(56) References Cited

U.S. PATENT DOCUMENTS

2013/0341784 A1* 12/2013 Lin .................. H01L 24/19
257/737

* cited by examiner

Primary Examiner — Sonya D McCall Shepard
(74) Attorney, Agent, or Firm — Slater Matsil, LLP

(57) ABSTRACT

Chip packages and methods of manufacture thereof are disclosed. In some embodiments, a chip package may include: a chip having a contact pad disposed at a first side of the chip; a passivation layer over the first side of the chip, the passivation layer having an opening disposed over the contact pad; a polymer layer over the passivation layer, the polymer layer having an edge disposed over the contact pad; a conductive structure formed atop the contact pad, the conductive structure filling the opening of the passivation layer and covering the edge of the polymer layer; and a frontside redistribution layer (RDL) disposed over the conductive structure, the frontside RDL having a first portion electrically connected to the conductive structure and a second portion electrically connected to the first portion and extending laterally away from the first portion and the conductive structure.

20 Claims, 9 Drawing Sheets

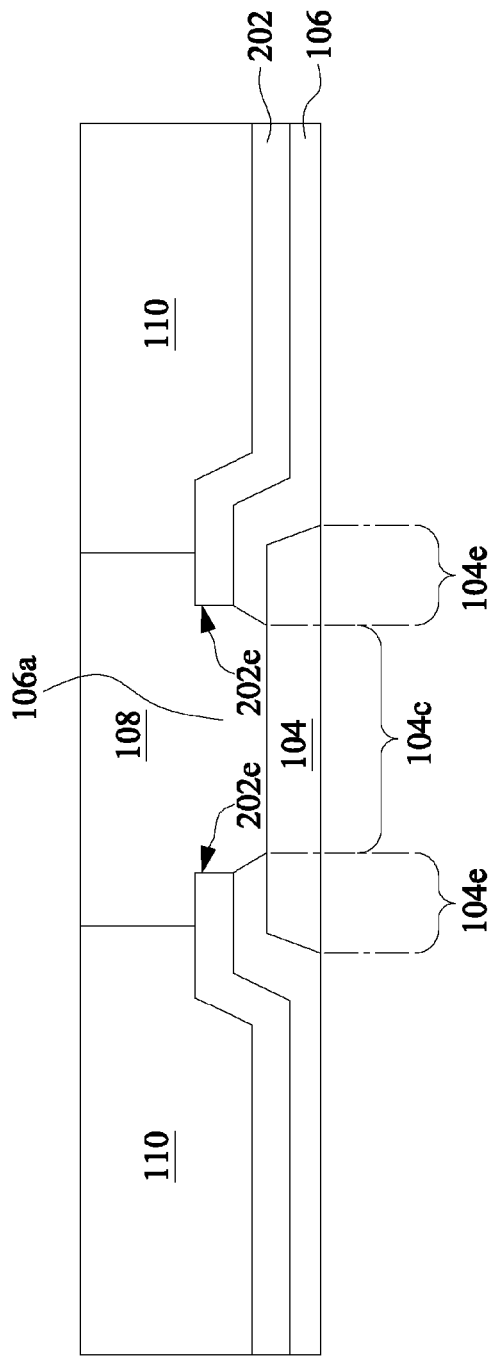
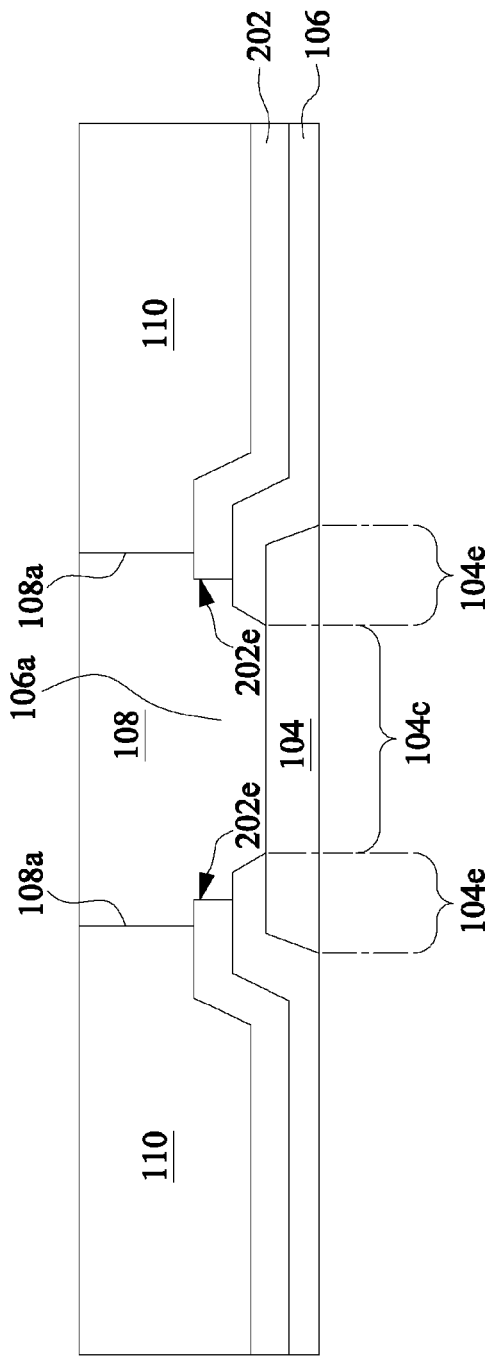
Fig. 1C
Fig. 1D

CHIP PACKAGES AND METHODS OF MANUFACTURING THE SAME

PRIORITY CLAIM AND CROSS-REFERENCE

This application claims the benefit of U.S. Provisional Application Ser. No. 61/991,316, filed on May 9, 2014, entitled "Low Stress Integrated Fanout Packages and Methods of Making Same," which application is hereby incorporated herein by reference.

BACKGROUND

In an aspect of packaging technologies, redistribution layers (RDLs) may be formed over a die and electrically connected to active devices in the die. Input/output (I/O) connectors such as solder balls on under-bump metallurgy (UBMs) may then be formed to electrically connect to the die through the RDLs. An advantageous feature of this packaging technology is the possibility of forming fan-out packages. Thus, the I/O pads on the die can be redistributed to cover a greater area than the die, and hence the number of I/O pads packed on the surfaces of the packaged dies can be increased.

Integrated Fan Out (InFO) package technology is becoming increasingly popular, particularly when combined with Wafer Level Packaging (WLP) technology. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B to FIG. 1D show in greater detail a region of the chip package shown in FIG. 1A, in accordance with some embodiments.

DETAILED DESCRIPTION

Figure 1A:
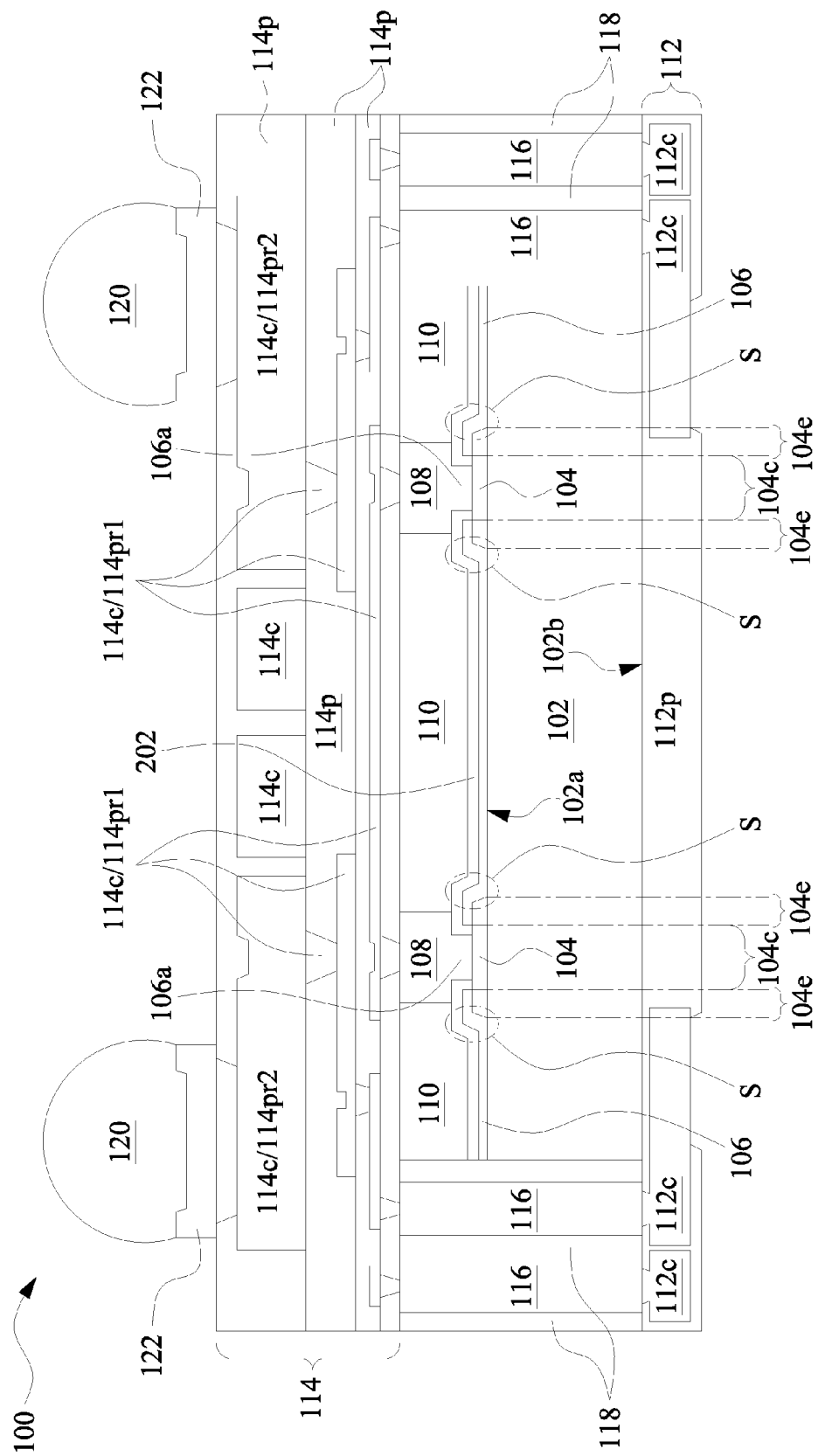
FIG. 1A shows a chip package including a polymer layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" or the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows a chip package 100 including a polymer layer 202, in accordance with one or more embodiments. The chip package 100 may include, or may be, an integrated fan-out (InFO) package, as an example. The chip package 100 may include a chip 102, which may also be referred to as a die. The chip 102 may have been subjected to one or more functional tests (e.g. electrical connection and stress tests) and may have passed such functional tests. In such an example, the chip 102 may be a known good die (KGD). Only one chip 102 is shown in FIG. 1A, however, in another example, a plurality of chips 102 (e.g. two, three, four, or more chips) may be included in the chip package 100. In such an example, the plurality of chips may be arranged laterally adjacent to each other in the chip package 100.

The chip 102 may include, or may be, a semiconductor die and could be any type of integrated circuit, examples of which include a processor, logic circuitry, memory, analog circuit, digital circuit, mixed signal, imaging device, MEMS device, and the like. The chip 102 may include a substrate, one or more active devices, and an interconnect structure. The substrate, one or more active devices, and interconnect structure of the chip 102 are not shown in FIG. 1A for the sake of simplicity.

The substrate of the chip 102 may be a bulk silicon substrate, although other semiconductor materials including group III, group IV, and group V elements may also be used. Alternatively, the substrate may be a silicon-on-insulator substrate, a germanium-on-insulator substrate, or the like. The one or more active devices of the chip 102 may be formed within and/or atop the substrate of the chip 102 using suitable semiconductor manufacturing processes. The one or more active devices may include, or may be, one or more transistors, as examples. The interconnect structure of the chip 102 may be formed over the substrate and the one or more active devices of the chip 102. The interconnect structure may electrically connect the one or more active devices of the chip 102 to form functional circuits. The interconnect structure may include one or more inter-layer dielectric (ILD) layers and/or one or more inter-metal dielectric (IMD) layers containing conductive features formed therein. The formation of the conductive features in the one or more ILD and/or IMD layers may include forming one or more ILD and/or IMD layers (e.g. by a spin coating process), patterning the one or more ILD and/or IMD layers (e.g. using a combination of photolithography and etching processes), and forming the conductive features in the patterned one or more ILD and/or IMD layers (e.g. by depositing a seed layer in the patterns formed in the one or more ILD and/or IMD layers and overfilling the patterns with a conductive material which may be planarized subsequently). The conductive features may include, or may be, conductive lines and/or vias, which may include, or may consist of, a conductive material such as copper, aluminum, tungsten, combinations thereof, or the like. The one or more ILD and/or IMD layers may include, or may consist of, low-k dielectric materials having k values, for example, less than or equal to about 4.0 (e.g. less than or equal to about 2.8) disposed between the conductive features. In some embodiments, the one or more ILD and/or IMD layers of the interconnect structure may be include, or may consist of, for example, silicon oxide, SiCOH, undoped silica glass (USG), or the like.

The chip 102 may include input/output (I/O) features that may be formed over the interconnect structure of the chip 102, as an example. For example, contact pads 104 may be formed at a first side 102a of the chip 102 and over the one or more ILD and/or IMD layers of the chip 102. Only two contact pads 104 are shown in the example of FIG. 1A, however, in another example, more than two contact pads 104 (e.g. three, four, five, or tens or more of contact pads 104) may be formed at the first side 102a of the chip 102. The contact pads 104 may include, or may consist of, a conductive material such as aluminum, copper, or the like. The contact pads 104 may be formed by any suitable process, such as a deposition and etching, damascene or dual damascene, or the like with any suitable conductive material.

In the example shown in FIG. 1A, the contact pads 104 are formed atop the first side 102a of the chip 102. However, in another example, surfaces of the contact pads 104 facing away from the chip 102 may be substantially coplanar with the first side 102a of the chip 102. The contact pads 104 may be electrically connected to the one or more active devices of the chip 102 through the various conductive features in the interconnect structure of the chip 102.

A passivation layer 106 may be formed over the first side 102a of the chip 102 and over portions of the contact pads 104. The passivation layer 106 may include, or may consist of, a dielectric material. Examples include one or more of a polyimide, a polymer, an oxide (e.g. a silicon containing oxide, e.g. SiO), a nitride (e.g. a silicon containing nitride, e.g. SiN), an oxynitride (e.g. a silicon containing oxynitride), undoped silicate glass (USG), or the like. The passivation layer 106 may protect the underlying layers of the chip 102 from various environmental contaminants and may be coated and patterned over the first side 102a of the chip 102 (e.g. using a combination of photolithography and etching processes) to provide openings 106a over the contact pads 104. As shown in FIG. 1A, the openings 106a may be substantially aligned with the contact pads 104 and may expose central portions 104c the contact pads 104, while edge regions 104e thereof may be covered by the passivation layer 106. The passivation layer 106 may include, or may be, a conformal layer that is formed over the first side 102a of the chip 102 and over the edge portions 104e of the contact pads 104. For example, the passivation layer 106 may have step regions S between the portions of the passivation layer 106 disposed over the first side 102a of the chip 102 and the portions of the passivation layer 106 disposed over the edge portions 104e of the contact pads 104.

As shown in FIG. 1A, the chip package 100 includes the polymer layer 202, which may be disposed atop the passivation layer 106. The chip package 100 may also include conductive pillars 108 disposed over and electrically connected to the contact pads 104. For example, a respective conductive pillar of the conductive pillars 108 may be disposed over a respective contact pad of the contact pads 104. As shown in FIG. 1A, the conductive pillars 108 may additionally be disposed over portions of the passivation layer 106 and the polymer layer 202 that are over the edge portions 104e of the contact pads 104. For example, the conductive pillars 108 may extend through the openings 106a in the passivation layer 106 and may also extend laterally to cover at least a portion of the passivation layer 106 and the polymer layer 202 at the edge portions 104e of the contact pads 104. In some embodiments, the conductive pillars 108 may include, or may consist of, copper although other suitable materials (e.g. metals and/or metal alloys) may also be used for the conductive pillars 108. The conductive pillars 108 may have a height H1 of about 5 micrometers to about 20 micrometers, for example.

Figure 1B:
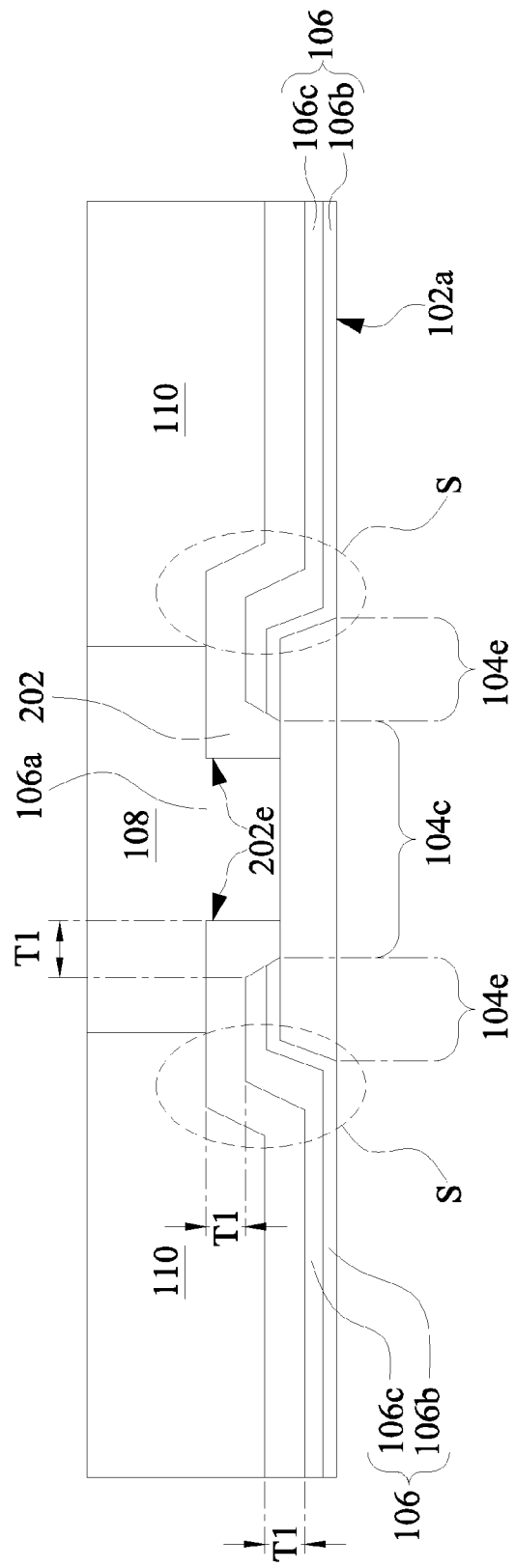

FIG. 1B shows in greater detail one of the contact pads 104, the passivation layer 106, the polymer layer 202, and one of the conductive pillars 108 of the chip package 100 shown in FIG. 1A. As shown in FIG. 1B, the passivation layer 106 may include a first layer 106b proximate the first side 102a of the chip 102 and disposed over the edge regions 104e of the contact pad 104. The first layer 106b may include, or may consist of, an oxide (e.g. a silicon containing oxide, e.g. SiO). The passivation layer 106 may also include a second layer 106b formed atop the first layer 106a. The second layer 106c may include, or may consist of, a nitride (e.g. a silicon containing nitride, e.g. SiN). The first layer 106b (e.g. including an oxide) may be formed by any oxidation process, such as wet or dry thermal oxidation in an ambient comprising an oxide, $H_2O$, NO, or a combination thereof, or by CVD techniques using tetra-ethyl-ortho-silicate (TEOS) and oxygen as a precursor. The second layer 106c (e.g. including a nitride) may be formed using chemical vapor deposition (CVD) techniques using silane and ammonia as precursor gases to a thickness of about 2000 Å, as an example.

The chip package 100 can undergo temperature changes during its fabrication process, during operation, and/or under reliability tests, as examples. Since materials used in the various features of the chip package 100 can have varying coefficients of thermal expansion (CTEs) and/or moduli of elasticity, various mechanical and thermal stresses can be induced in the chip package 100.

As applied to the example shown in FIG. 1B, the first layer 106b and the second layer 106c of the passivation layer 106 may have different CTEs. For example, the first layer 106b of the passivation layer 106 may have a CTE in a range from about 0.2 parts per million (ppm) per degree Celsius to about 1 ppm per degree Celsius (e.g. about 0.5 ppm per degree Celsius) while the second layer 106c of the passivation layer 106 may have a CTE in a range from about 2 ppm per degree Celsius to about 8 ppm per degree Celsius (e.g. about 5 ppm per degree Celsius).

Furthermore, the first layer 106b and the second layer 106c of the passivation layer 106 may have different moduli of elasticity. For example, the first layer 106b of the passivation layer 106 (e.g. layer including an oxide, e.g. SiO) may have a modulus of elasticity in a range from about 10 GPa to about 80 GPa (e.g. about 70 GPa), while the second layer 106c of the passivation layer 106 (e.g. layer including a nitride, e.g. SiN) may have a modulus of elasticity in a range from about 180 GPa to about 220 GPa (e.g. about 210 GPa). In other words, the first layer 106b of the passivation layer 106 may be more brittle (e.g. less pliable) than the second layer 106c of the passivation layer 106. The brittleness of the first layer 106b may result in the passivation layer 106 having a low fracture strength.

In addition, the CTEs and/or moduli of elasticity of the first layer 106b and the second layer 106c of the passivation layer 106 may be different from the CTEs and/or moduli of elasticity of the conductive pillars 108 and the contact pads 104. For example, the CTE of the conductive pillars 108 and/or the CTE of the contact pads 104 may be in a range from about 10 ppm per degree Celsius to about 20 ppm per degree Celsius (e.g. about 17 ppm per degree Celsius). By way of another example, the moduli of elasticity of the contact pads 104 and the conductive pillars 108 may be in a range from about 70 GPa to about 150 GPa (e.g. about 120 GPa). These ranges are different from the above-mentioned ranges for CTEs and/or moduli of elasticity of the first layer 106b and the second layer 106c of the passivation layer 106.

The CTE and/or modulus of elasticity mismatch among these features of the chip package 100 may induce thermal and mechanical stresses in the chip package 100, which can result in cracks in the passivation layer 106 (e.g. in the first layer 106b of the passivation layer 106). The risk of cracks in the passivation layer 106 is exacerbated in regions that already have high mechanical stress, e.g. due to topology. Examples of such regions include the step regions S shown in FIG. 1A and FIG. 1B. When formed, the cracks in the passivation layer 106 can adversely affect manufacturing yield and reliability of the chip package 100.

The polymer layer 202 reduces the mechanical and thermal stress formed between the conductive pillars 108 and the passivation layer 106. Specifically, the polymer layer 202 may include, or may be, a material that has a CTE and/or a modulus of elasticity that is intermediate that of the passivation layer 106 and the conductive pillars 108, thus reducing the mechanical and thermal stress formed between the conductive pillars 108 and the passivation layer 106. For example, the material of the polymer layer 202 may include, or may be, a soft material, e.g. a material having a modulus of elasticity in a range from about 0.5 GPa to about 5.0 GPa (e.g. about 2.1 GPa) below glass transition temperature (Tg). Accordingly, the material of the polymer layer 202 may be more compliant (e.g. less brittle or more pliable) compared to the passivation layer 106. For example, the material of the polymer layer 202 may be more compliant compared to the first layer 106b (e.g. oxide layer) of the passivation layer 106. By way of another example, the material of the polymer layer 202 may include, or may be, a material having a CTE in a range from about 10 ppm/° C. to about 100 ppm/° C. (e.g. about 80 ppm/T) below glass transition temperature.

The polymer layer 202 may include, or may consist of, a polymer material capable of functioning as a stress buffer material. Examples include at least one of polyimide (PI), polybenzoxazole (PBO), and one or more polymer materials available from JSR (Japanese Synthetic Rubber Co. Ltd., Tokyo, Japan), HDM (Hitachi-Dupont), or the like. Other examples include an organic material (e.g. a carbon containing material) or an epoxy-based material (e.g. a phenol-based epoxy).

As shown in FIG. 1B, the polymer layer 202 may be formed atop the passivation layer 106 and may additionally line sidewalls of the opening 106a of the passivation layer 106 by which contact is made by the conductive pillars 108 to the contact pads 104. Accordingly, in the example shown in FIG. 1B and FIG. 1A, the polymer layer 202 completely covers the passivation layer 106. Stated in another way, an edge 202e of the polymer layer 202 is disposed within the central portions 104c of the contact pads 104. Consequently, a diameter of the opening 106a is decreased by the polymer layer 202. A thickness T1 of the polymer layer 202 may be in a range from about 2 micrometers to about 8 micrometers, e.g. about 5 micrometers. Accordingly, the diameter of the opening 106a may be decreased by about 4 micrometers (2 micrometers×2 sidewalls) to about 16 micrometers (8 micrometers×2 sidewalls).

FIG. 1C shows in greater detail another embodiment where the polymer layer 202 is only formed atop the passivation layer 106. In the embodiment of FIG. 1C, the opening 106a of the passivation layer 106 is not lined by the polymer layer 202. In such an embodiment, the edge 202e of the polymer layer 202 is substantially aligned with a perimeter of the opening 106 at a mouth of the opening 106, as shown in FIG. 1C. Stated in another way, the edge 202e of the polymer layer 202 is disposed within the edge portions 104e of the contact pads 104. In the example shown in FIG. 1C, the diameter of the opening 106a is unchanged by the polymer layer 202.

FIG. 1D shows another embodiment in which the edge 202e of the polymer layer 202 is distal from the perimeter of the opening 106 at the mouth of the opening 106 and proximate an edge 108a of the conductive pillars 108. Stated in another way, the edge 202e of the polymer layer 202 is disposed within the edge portions 104e of the contact pads 104. In the embodiment of FIG. 1D, a portion of the passivation layer 106 in the edge regions 104e of the contact pads 104 is free from the polymer layer 202. In the example shown in FIG. 1D, the diameter of the opening 106a is unchanged by the polymer layer 202.

The choice of which of the designs shown in FIG. 1B to FIG. 1D is chosen for the polymer layer 202 may depend, at least in part, on where most of the thermal and mechanical stresses are exerted. As an illustration, in an example where most of the thermal and mechanical stresses are exerted within the opening 106a, the design shown in FIG. 1B may be chosen since the polymer layer 202 lining the opening 106 can reduce or eliminate the thermal and mechanical stresses exerted within the opening 106a. In another example where most of the thermal and mechanical stresses are exerted at a top surface of the passivation layer 106, the designs shown in FIG. 1C or FIG. 1D may be chosen. Another consideration that may guide the choice of which of the designs shown in FIG. 1B to FIG. 1D is chosen for the polymer layer 202 may be the contact resistance between the conductive pillars 108 and the contact pads 104. For example, in the arrangement shown in FIG. 1B, the conductive pillar 108 has a smaller diameter than the conductive pillars shown in FIG. 1C and FIG. 1D. Consequently, the contact resistance between the conductive pillars 108 and the contact pads 104 of FIG. 1B may be larger than the contact resistance between the conductive pillars 108 and the contact pads 104 of FIG. 1C and FIG. 1D. If this increased contact resistance is not desired, then the designs shown in FIG. 1C and FIG. 1D may instead be chosen.

The polymer layers 202 shown in FIG. 1A to FIG. 1D may be formed by coating the passivation layer 106 with a suitable stress buffer material, e.g. using a spin coating process and patterning the coated material (e.g. using a combination of photolithography and etching processes) to form openings therein. The openings of the polymer layer 202 may be substantially aligned with the contact pads 104, as shown in FIG. 1A to FIG. 1D.

The chip package 100 may include an insulating layer 110 disposed over the polymer layer 202. A surface of the insulating layer 110 facing away from the first side 102a of the chip 102 may be substantially coplanar with a surface of the conductive pillars 108 facing away from the first side 102a of the chip 102, as shown in FIG. 1A. The insulating layer 110 may include, or may consist of, an insulating material, such as PI, PBO, benzocyclobuten (BCB), epoxy, silicone, acrylates, nano-filled pheno resin, siloxane, a fluorinated polymer, polynorbornene, or the like. In an embodiment, the material of the insulating layer 110 may be different from the material of the polymer layer 202.

In an embodiment, the insulating layer 110 may be formed by coating the polymer layer 202 with a suitable material (e.g. PI, PBO, etc.) and patterning the coated material to form openings therein (e.g. using a combination of photolithography and etching processes). The conductive pillars 108 may thereafter be formed in the openings of the patterned insulating layer 110 by filling the openings of the patterned insulating layer 110 with conductive material. The filling of the openings of the patterned insulating layer 110 may include depositing a seed layer in the openings and plating the openings (e.g. electro-chemically plating, electroless plating, and the like) with a conductive material. The conductive material may overfill the openings of the patterned insulating layer 110, and a CMP may be performed to remove excess portions of the conductive material over the insulating layer 110 to form the conductive pillars 108.

In another embodiment, the conductive pillars 108 may already be formed over the contact pads 104 (e.g. by electro-chemically plating, electroless plating, and the like). The insulating layer 110 may thereafter be formed over the polymer layer 202 and the conductive pillars 108 (e.g. by a coating or deposition process), which may cover the polymer layer 202 and the surface of the conductive pillars 108 facing away from the first side 102a of the chip 102. The insulating layer 110 may subsequently be planarized to expose the surface of the conductive pillars 108 facing away from the first side 102a of the chip 102.

The chip package 100 may include a backside redistribution layer (RDL) 112 formed at a second side 102b of the chip 102 opposite the first side 102a. The backside RDL 112 may include conductive features 112c (e.g. conductive lines and/or vias) formed in one or more first dielectric layers 112p. The one or more first dielectric layers 112p of the backside RDL 112 may be formed of any suitable material (e.g. PI, PBO, BCB, epoxy, silicone, acrylates, nano-filled pheno resin, siloxane, a fluorinated polymer, polynorbornene, or the like) using any suitable method, such as, spin-on coating, sputtering, or the like. The formation of the conductive features 112c in the one or more first dielectric layers 112p may include patterning the one or more dielectric layers 112p (e.g. using a combination of photolithography and etching processes) and forming the conductive features 112c in the patterned one or more first dielectric layers 112p (e.g. by a damascene and/or dual damascene process). The conductive features 112c may be designed to form functional circuits and/or input/output features for other electrical components (e.g. chips) that may be electrically connected to the chip 102.

The chip package 100 may include a frontside RDL 114, which may be, but is not limited to being, substantially similar to the backside RDL 112 both in composition and formation process. For example, the frontside RDL 114 may include conductive features 114c (e.g. conductive lines and vias) disposed between one or more second dielectric layers 114p. The conductive features 114c may be electrically connected to the chip 102 through the conductive pillars 108. The frontside RDL 114 may include a first portion 114pr1 that is coupled (e.g. electrically coupled) to the conductive pillars 108, as shown in the example of FIG. 1. The frontside RDL 114 may further include a second portion 114pr2 that is coupled (e.g. electrically coupled) to the first portion 114pr1 and that extends laterally away from the first portion 114pr1 and the conductive pillars 108. Accordingly, electrical connections from the conductive pillars 108 may be fanned-out by means of the frontside RDL 114. Consequently, the frontside RDL 114 may also be referred to as a fan-out structure. The frontside RDL 114 and the backside RDL 112 may be electrically connected to each other by conductive vias 116 disposed laterally adjacent to the chip 102. Only four conductive vias 116 are shown in FIG. 1A as an example. However, in another example, the number of conductive vias 116 may be less than four (e.g. two, three) conductive vias 116 or may be more than four (e.g. five, six, or even more) conductive vias 116.

The chip package 100 may include a molding compound 118 that fills gaps between the chip 102 and the conductive vias 116. The molding compound 118 may include any suitable material such as an epoxy resin, a molding underfill, or the like. Additional package features, such as external connectors 120 and other surface mount devices (SMDs) (not shown in FIG. 1A) may be disposed over the frontside RDL 114. The connectors 120 may be a ball grid array (BGA), controlled collapse chip connector (C4) bumps, or the like disposed on under metal metallurgies (UBMs) 122, which may be formed over the frontside RDL 114. The connectors 120 and SMDs may be electrically connected to the chip 102 by way of the frontside RDL 114. The connectors 120 may be used to electrically connect the chip package 100 to other package components such as another device die, interposers, package substrates, printed circuit boards, a mother board, or the like.

In an embodiment, the molding compound 118 may be formed by first encapsulating the chip 102 with a suitable material (e.g. epoxy resin, etc.) and patterning the encapsulant to form openings therein (e.g. using a combination of photolithography and etching processes). The conductive vias 116 may thereafter be formed in the openings of the patterned molding compound 118 by filling the openings of the patterned molding compound 118 with conductive material. The filling of the openings of the molding compound 118 may include depositing a seed layer in the openings and plating the openings (e.g. electro-chemically plating, electroless plating, and the like) with a conductive material. The conductive material may overfill the openings of the patterned molding compound 118, and a CMP may be performed to remove excess portions of the conductive material over the molding compound 118 to form the conductive vias 116.

In another embodiment, the conductive vias 116 may already be formed to electrically connect the frontside RDL 114 and the backside RDL 112. The molding compound 118 may thereafter be formed by encapsulating the chip 102, and the conductive vias 116 with a suitable material (e.g. epoxy resin, etc.) and patterning the encapsulant to remove portions that may extend laterally beyond the boundary of the chip package 100.

Figure 2A:
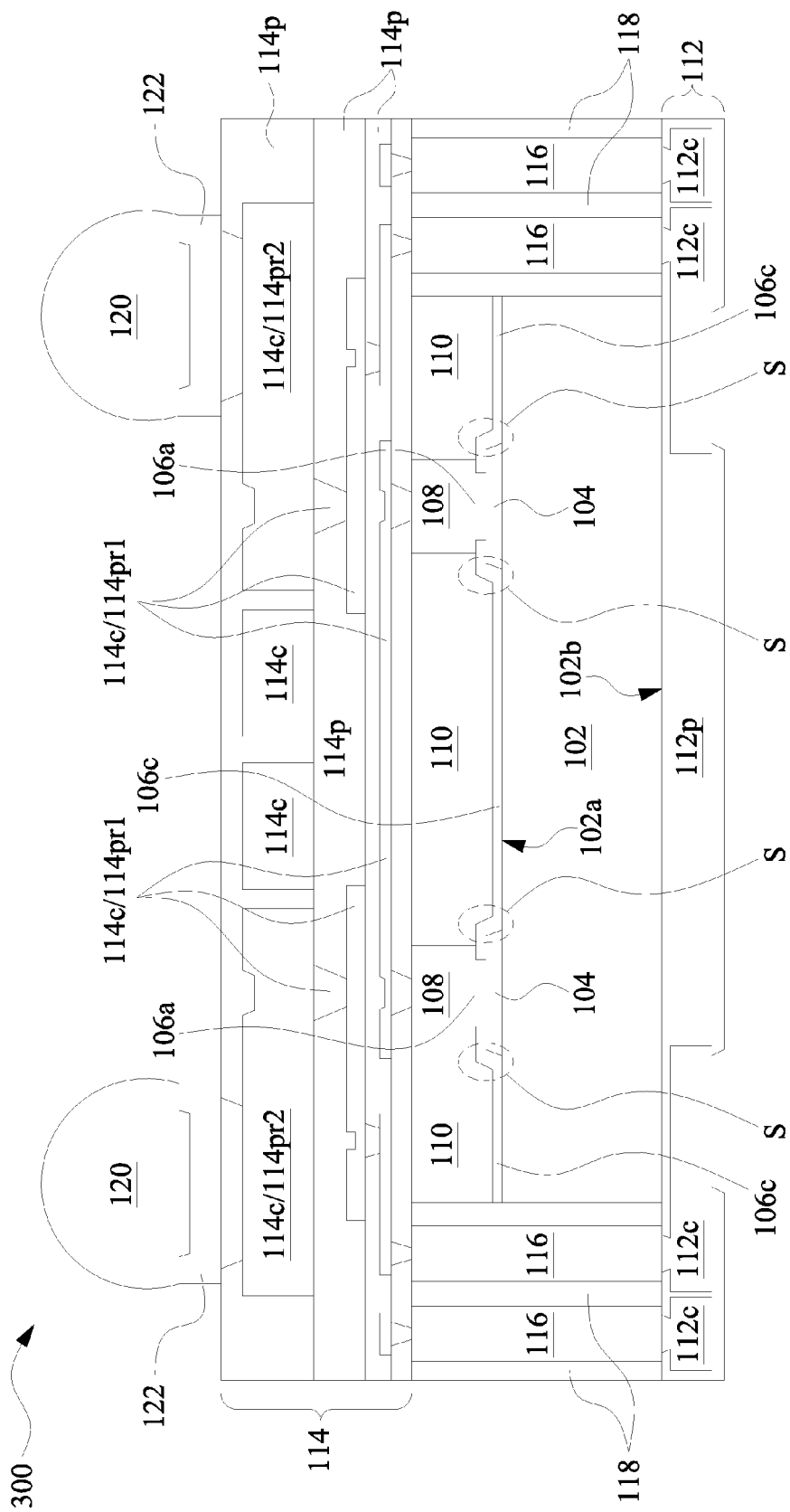
FIG. 2A shows a chip package including a nitride containing layer, in accordance with some embodiments.
Figure 2B:
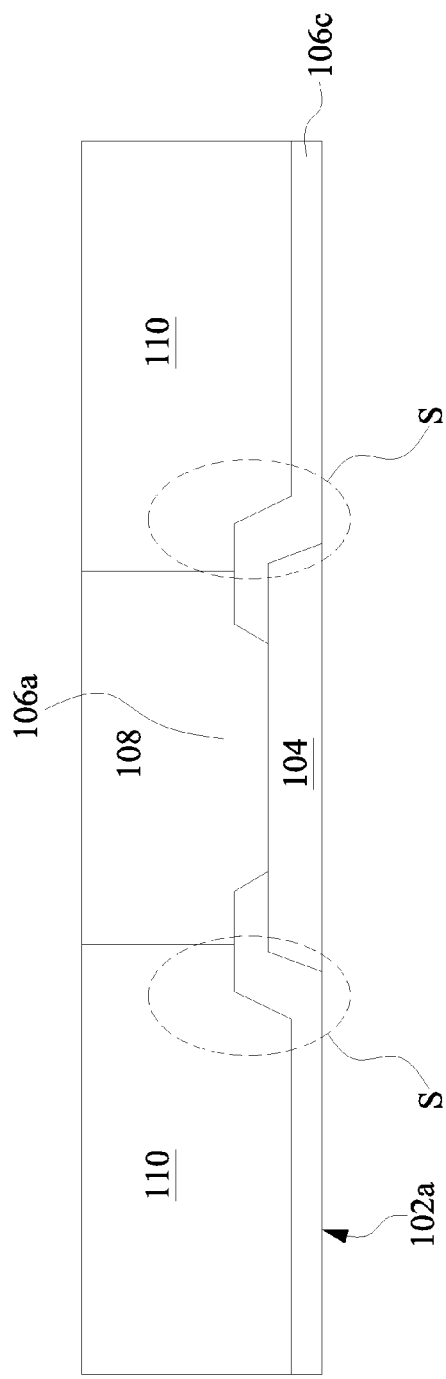
FIG. 2B show in greater detail a region of the chip package shown in FIG. 2A, in accordance with some embodiments.

FIG. 2A shows a chip package 300, in accordance with one or more embodiments. In the chip package 300, the first layer 106b of the passivation layer 106 is omitted and only the second layer 106c of the passivation layer 106 (e.g. including a nitride material, e.g. SiN) is used to provide electrical and environmental protection to the chip 102. FIG. 2B shows in greater detail the second layer 106c of the passivation layer 106 shown in FIG. 2A. As described above, the CTE of the first layer 106b of the passivation layer 106 may be in a range from about 0.2 ppm per degree Celsius to about 1 ppm per degree Celsius, the CTE of the second layer 106c of the passivation layer 106 may be in a range from about 2 ppm per degree Celsius to about 8 ppm per degree Celsius, and the CTE of the conductive pillars 108 and the CTE of the contact pads 104 may be in a range from about 10 ppm per degree Celsius to about 20 ppm per degree Celsius. Accordingly, the CTE mismatch among these features may be reduced by the omission of the first layer 106b of the passivation layer 106. Furthermore, the second layer 106c of the passivation layer 106 may be more pliable (e.g. less brittle) than the first layer 106b of the passivation layer 106. Accordingly, by eliminating the first layer 106b, the passivation layer 106 including only the second layer 106c (e.g. including a nitride) may be more robust against thermal and mechanical stresses and hence, more resistant to cracking.

Figure 2C:
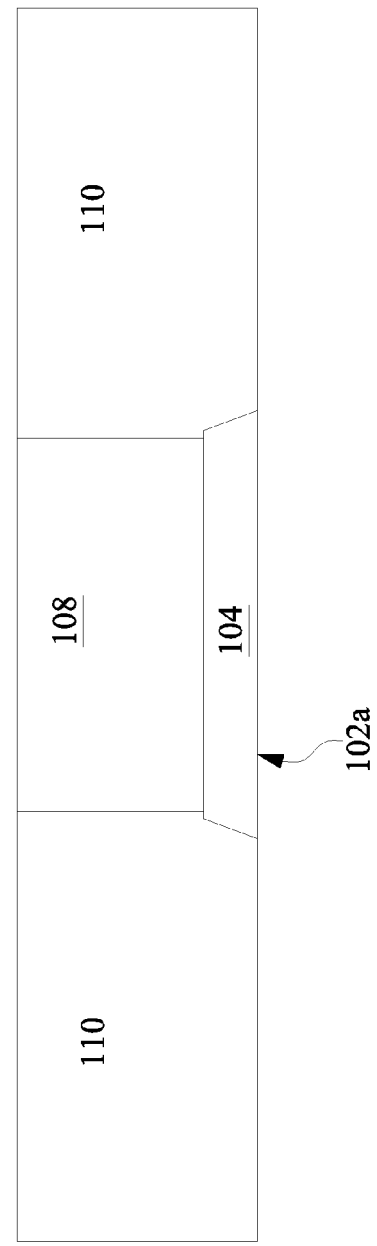
FIG. 2C and FIG. 3 shows a conductive structure formed on a surface of a chip and a conductive pillar formed atop the conductive structure, in accordance with some embodiments.

In FIG. 2A and FIG. 2B, there may still be thermal and mechanical stresses due to a difference in the CTEs and/or moduli of elasticity of the second layer 106c of the passivation layer 106 and the conductive pillars 108 and contact pads 104. Furthermore, the step regions S may experience high mechanical stress, e.g. due to topology. Consequently, as shown in FIG. 2C, the passivation layer 106 can be eliminated entirely to avoid thermal and mechanical stress caused by the step regions S as well as the CTE and/or moduli of elasticity mismatch between the passivation layer 106 and the conductive pillars 108 and contact pads 104.

Figure 3:
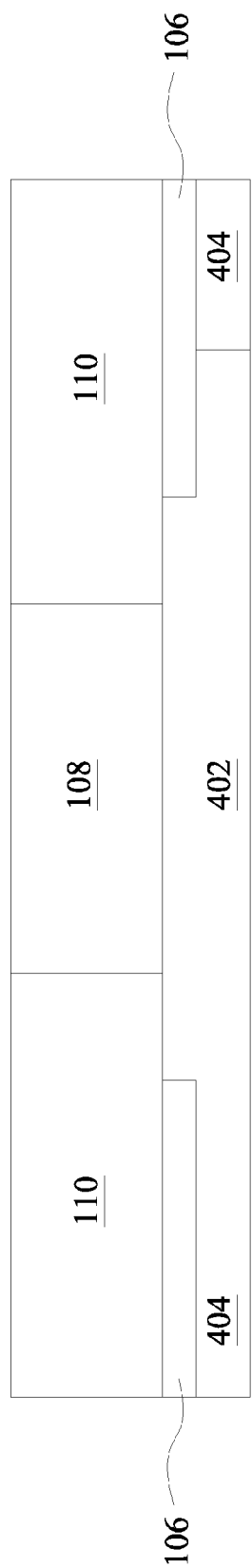

FIG. 3 shows another example by which thermal and mechanical stress can be reduced or eliminated in a chip package. In the example of FIG. 3, the contact pads 104 are eliminated. Instead, the conductive pillars 108 are formed over a top metal element 402 that may be disposed in a top metal layer of the interconnect structure of the chip 102. As shown in FIG. 3, the top metal element 402 is formed in a dielectric layer 404 (e.g. including or consisting of USG), which may be an IMD layer of the interconnect structure of the chip 102. In the example shown in FIG. 3, the passivation layer 106 is substantially planar over the first surface 102a of the chip 102 and substantially coplanar with a surface of the top metal element 402. Accordingly, step regions S in the passivation layer 106 are eliminated, thus eliminating some regions of the chip package that may experience high thermal and mechanical stresses. Another advantage of the arrangement shown in FIG. 3 is that a contact area between the conductive pillars 108 and the top metal element 402 is increased. Accordingly, the arrangement shown in FIG. 3 may have lower contact resistance and better electrical and mechanical performance as compared to the arrangement shown in FIG. 1A to FIG. 1D and FIG. 2A and FIG. 2B.

The various chip packages shown in FIG. 1A to FIG. 3 provide several effects. For example, the thermal and mechanical stresses in the chip packages may be reduced, thus improving manufacturing yield, device reliability, and device lifetime. This may also lead to potential cost reduction in the manufacture of such chip packages. Furthermore, the chip packages shown in FIG. 1A to FIG. 3 may be manufactured using existing fabrication process. More specifically, the polymer layer 202 shown in the chip packages of FIG. 1A to FIG. 1D may be formed using existing silicon fabrication processes. On the other hand, the chip packages of FIG. 2A to FIG. 3 allow a simplified design of the passivation layer 106 (if any), thus providing a means to reduce manufacturing costs of the chip packages.

Figure 4:
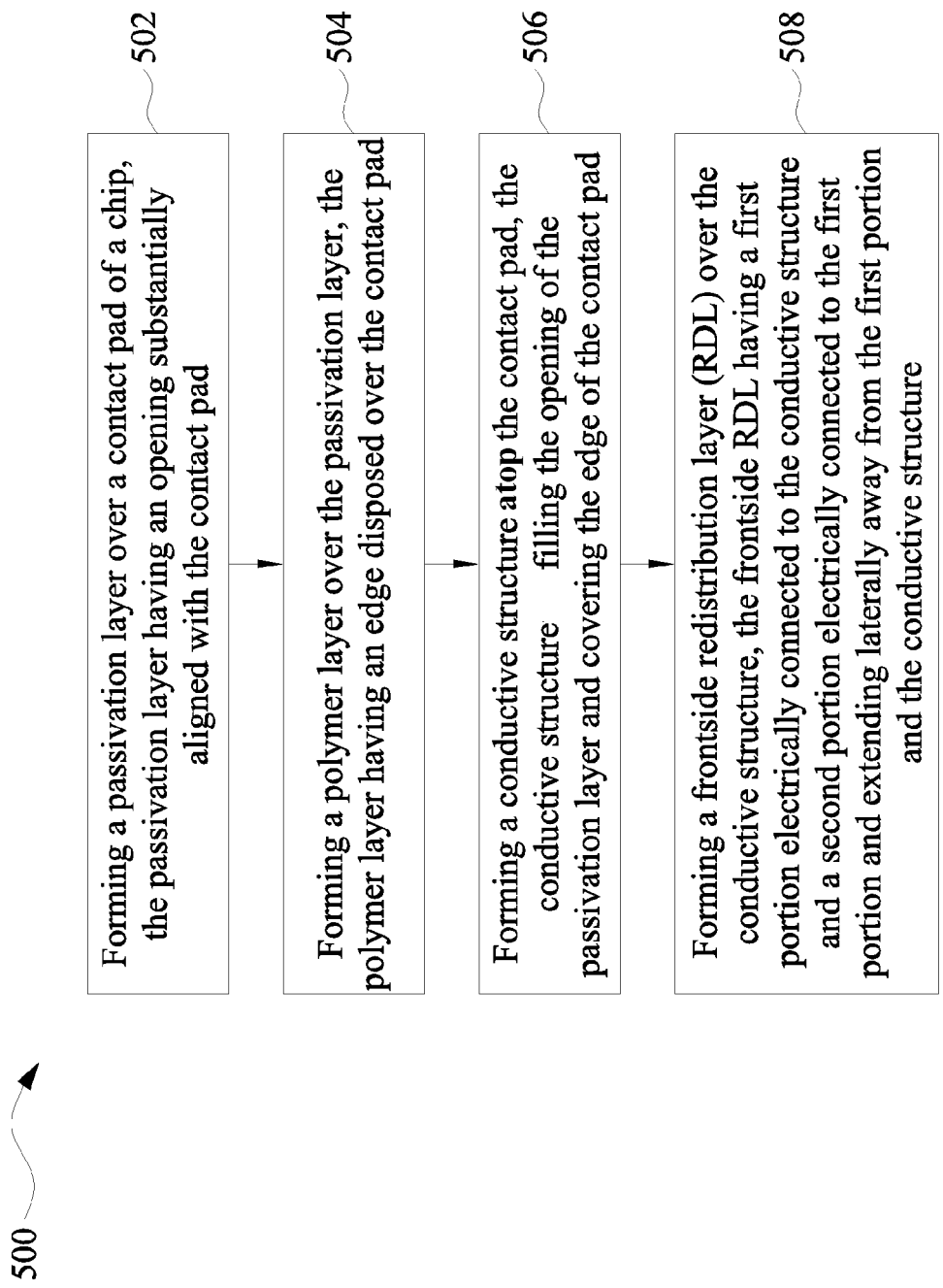
FIG. 4 to FIG. 6 show methods of manufacturing a chip package, in accordance with some embodiments.

FIG. 4 shows a method 500 of manufacturing a chip package. The method 500 may, for example, be used to manufacture the chip package 100 shown in FIG. 1A and having any one of the contact pad arrangements shown in FIG. 1B to FIG. 1D. The method 500 may include: forming a passivation layer over a contact pad of a chip, the passivation layer having an opening substantially aligned with the contact pad (in 502); forming a polymer layer over the passivation layer, the polymer layer having an edge disposed over the contact pad (in 504); forming a conductive structure atop the contact pad, the conductive structure filling the opening of the passivation layer and covering the edge of the contact pad (in 506); and forming a frontside redistribution layer (RDL) over the conductive structure, the frontside RDL having a first portion electrically connected to the conductive structure and a second portion electrically connected to the first portion and extending laterally away from the first portion and the conductive structure (in 508). While the method 500 has been described in the sequence presented in FIG. 4, it should be noted that the method 500 is not limited to the sequence of steps shown in FIG. 4.

Figure 5:
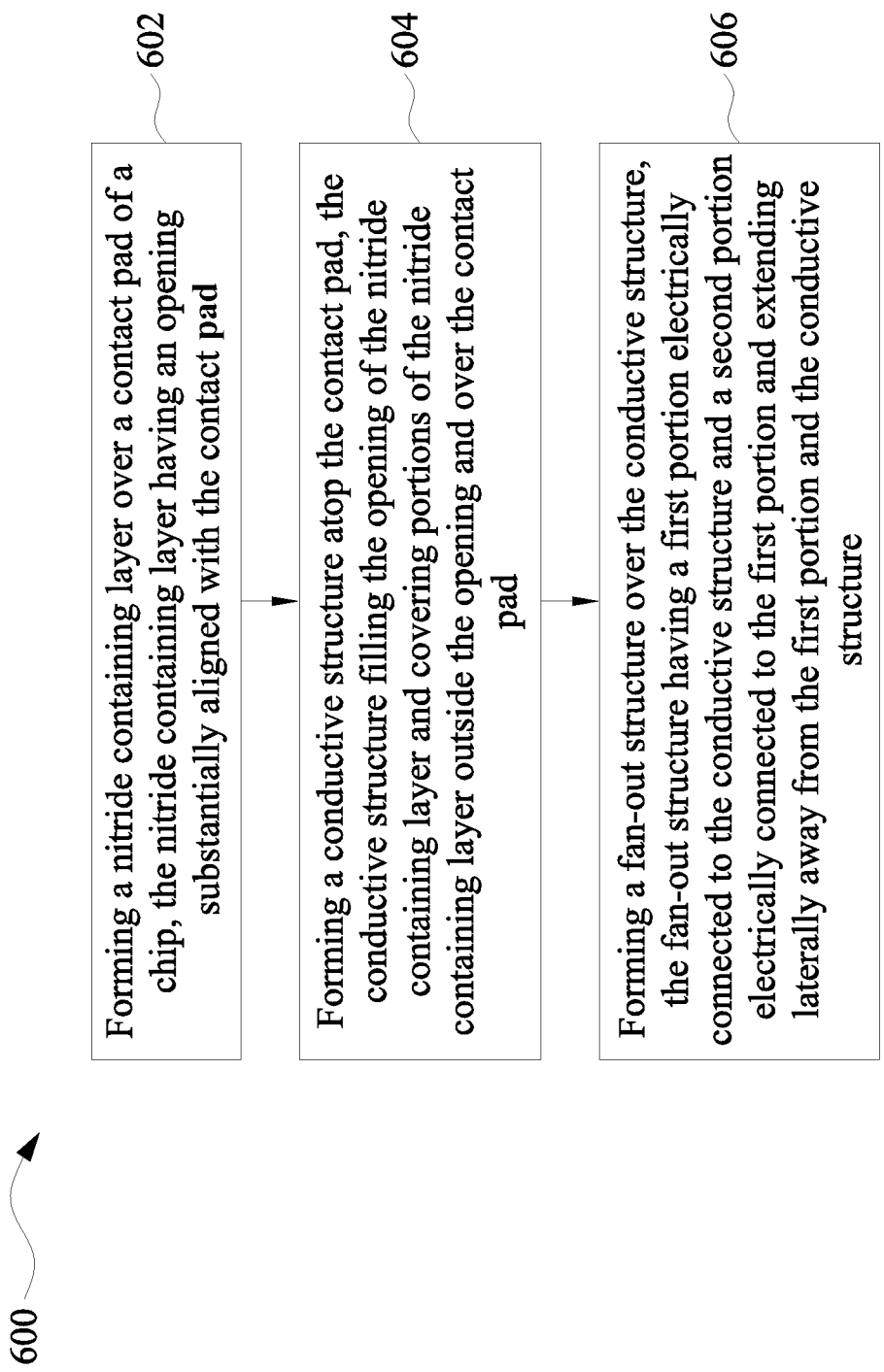

FIG. 5 shows a method 600 of manufacturing a chip package. The method 600 may, for example, be used to manufacture the chip package 300 shown in FIG. 2A. The method 600 may include: forming a nitride containing layer over a contact pad of a chip, the nitride containing layer having an opening substantially aligned with the contact pad (in 602); forming a conductive structure atop the contact pad, the conductive structure filling the opening of the nitride containing layer and covering portions of the nitride containing layer outside the opening and over the contact pad (in 604); and forming a fan-out structure over the conductive structure, the fan-out structure having a first portion electrically connected to the conductive structure and a second portion electrically connected to the first portion and extending laterally away from the first portion and the conductive structure (in 606). While the method 600 has been described in the sequence presented in FIG. 5, it should be noted that the method 600 is not limited to the sequence of steps shown in FIG. 5.

Figure 6:
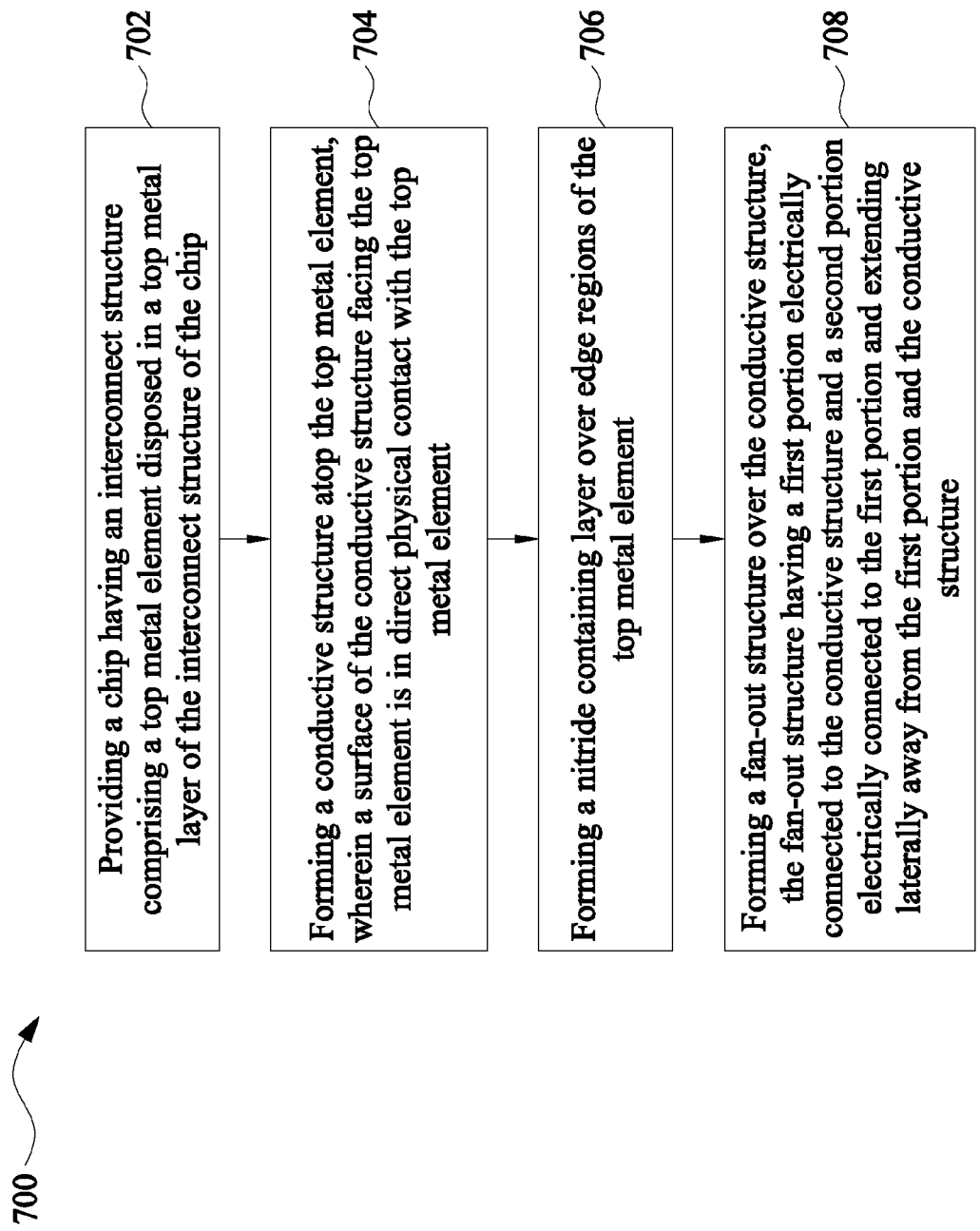

FIG. 6 shows a method 700 of manufacturing a chip package. The method 700 may, for example, be used to manufacture a chip package having an arrangement shown in FIG. 3. The method 700 may include: providing a chip having an interconnect structure comprising a top metal element disposed in a top metal layer of the interconnect structure of the chip (in 702); forming a conductive structure atop the top metal element, wherein a surface of the conductive structure facing the top metal element is in direct physical contact with the top metal element (in 704); forming a nitride containing layer over edge regions of the top metal element (in 706); and forming a fan-out structure over the conductive structure, the fan-out structure having a first portion electrically connected to the conductive structure and a second portion electrically connected to the first portion and extending laterally away from the first portion and the conductive structure (in 708). While the method 700 has been described in the sequence presented in FIG. 6, it should be noted that the method 700 is not limited to the sequence of steps shown in FIG. 6.

According to an embodiment presented herein, a chip package may be provided. The chip package may include: a chip having a contact pad disposed at a first side of the chip; a passivation layer over the first side of the chip, the passivation layer having an opening substantially aligned with the contact pad; a polymer layer over the passivation layer, the polymer layer having an edge disposed over the contact pad; and a conductive structure formed atop the contact pad, the conductive structure filling the opening of the passivation layer and covering the edge of the polymer layer.

According to another embodiment presented herein, a chip package may be provided. The chip package may include: a chip having a contact pad disposed at a first side of the chip, the contact pad having edge portions and a central portion disposed between the edge portions; a passivation layer over the first side of the chip, the passivation layer having an opening exposing the central portion of the contact pad; a polymer layer over the passivation layer and over at least a portion of the edge regions of the contact pad; and a conductive structure formed atop the contact pad, the conductive structure filling the opening of the passivation layer and covering an edge of the polymer layer.

According to yet another embodiment presented herein, a chip package may be provided. The chip package may include: a chip having a first conductive structure disposed at a first side of the chip; and a second conductive structure formed atop the first conductive structure, wherein at least a portion of a surface of the second conductive structure facing the first conductive structure is in direct physical contact with the first conductive structure.

According to an embodiment presented herein, a method of manufacturing a chip package may be provided. The method may include: forming a passivation layer over a contact pad of a chip, the passivation layer having an opening substantially aligned with the contact pad; forming a polymer layer over the passivation layer, the polymer layer having an edge disposed over the contact pad; forming a conductive structure atop the contact pad, the conductive structure filling the opening of the passivation layer and covering the edge of the contact pad; and forming a frontside redistribution layer (RDL) over the conductive structure, the frontside RDL having a first portion electrically connected to the conductive structure and a second portion electrically connected to the first portion and extending laterally away from the first portion and the conductive structure.

According to another embodiment presented herein, a method of manufacturing a chip package may be provided. The method may include: forming a nitride containing layer over a contact pad of a chip, the nitride containing layer having an opening substantially aligned with the contact pad; forming a conductive structure atop the contact pad, the conductive structure filling the opening of the nitride containing layer and covering portions of the nitride containing layer outside the opening and over the contact pad; and forming a fan-out structure over the conductive structure, the fan-out structure having a first portion electrically connected to the conductive structure and a second portion electrically connected to the first portion and extending laterally away from the first portion and the conductive structure.

According to yet another embodiment presented herein, a method of manufacturing a chip package may be provided. The method may include: providing a chip having an interconnect structure comprising a top metal element disposed in a top metal layer of the interconnect structure of the chip; forming a conductive structure atop the top metal element, wherein a surface of the conductive structure facing the top metal element is in direct physical contact with the top metal element; forming a nitride containing layer over edge regions of the top metal element; and forming a fan-out structure over the conductive structure, the fan-out structure having a first portion electrically connected to the conductive structure and a second portion electrically connected to the first portion and extending laterally away from the first portion and the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
    a chip having a contact pad disposed at a first side of the chip;
    a passivation layer over the first side of the chip, the passivation layer having an opening disposed over the contact pad;
    a polymer layer over the passivation layer, the polymer layer having an edge disposed over the contact pad, wherein the edge of the polymer layer is distal from a perimeter of the opening of the passivation layer;
    a conductive structure formed atop the contact pad, the conductive structure filling the opening of the passivation layer and covering the edge of the polymer layer; and
    a fan-out structure disposed over the conductive structure, the fan-out structure having a first portion electrically connected to the conductive structure and a second portion electrically connected to the first portion and extending laterally away from the first portion and the conductive structure.

2. The chip package of claim 1, wherein the passivation layer comprises an oxide containing layer proximate the first side of the chip and a nitride containing layer proximate the polymer layer.

3. The chip package of claim 1, wherein the polymer layer comprises a carbon-containing material.

4. The chip package of claim 1, wherein the conductive structure comprises copper.

5. The chip package of claim 1, wherein a lateral extent of the conductive structure is disposed within a lateral extent of the contact pad.

6. The chip package of claim 1, further comprising:
    an insulating layer over the polymer layer, the insulating layer having a surface substantially coplanar with a surface of the conductive structure facing away from the chip.

7. The chip package of claim 1, further comprising:
    a backside redistribution layer disposed at a second side of the chip opposite the first side.

8. The chip package of claim 7, further comprising:
    a conductive via disposed laterally adjacent to the chip and electrically connecting the fan-out structure and the backside redistribution layer.

9. A chip package, comprising:
    a chip having a first conductive structure disposed at a first side of the chip;
    a second conductive structure formed atop the first conductive structure, wherein a first surface of the second conductive structure facing the first conductive structure is in direct physical contact with the first conductive structure;
    an insulating layer over the first side of the chip and around the second conductive structure, an upper surface of the insulating layer is level with a second surface of the second conductive structure opposing the first surface;

a conductive via disposed laterally to the chip, the conductive via extending from the upper surface of the insulating layer to at least a lower surface of the insulating layer opposing the upper surface; and a first redistribution layer (RDL) comprising a fan-out structure, the first RDL being disposed over the second conductive structure and the insulating layer, the fan-out structure having a first portion electrically connected to the second conductive structure and a second portion electrically connected to the first portion and extending laterally away from the first portion and the second conductive structure.

10. The chip package of claim 9, wherein the first conductive structure comprises a contact pad.

11. The chip package of claim 9, wherein the first conductive structure comprises a top metal element disposed in a top metal layer of an interconnect structure of the chip.

12. The chip package of claim 9, further comprising a nitride containing layer disposed over the first side of the chip, the nitride containing layer overlapping edge regions of the first conductive structure.

13. A chip package, comprising:
   a chip having a contact pad disposed over a first side thereof;
   a polymer layer disposed over the first side of the chip, a portion of the polymer layer disposed over an edge portion of the contact pad;
   a conductive pillar disposed over the contact pad, the conductive pillar in physical contact with a central portion of the contact pad and extending laterally over the portion of the polymer layer disposed over the edge portion of the contact pad, the conductive pillar contacting a first sidewall of the polymer layer and a second sidewall of the polymer layer opposing the first sidewall; and
   a passivation layer disposed between the first side of the chip and the polymer layer, wherein a portion of the passivation layer is disposed over the edge portion of the contact pad, wherein the passivation layer and the polymer layer differ in composition, wherein the conductive pillar contacts a third sidewall of the passivation layer and a fourth sidewall of the passivation layer opposing the third sidewall, wherein a first distance between the first sidewall and the second sidewall of the polymer layer is equal to or larger than a second distance between the third sidewall and the fourth sidewall of the passivation layer.

14. The chip package of claim 13, wherein the passivation layer comprises an oxide containing layer proximal the chip and a nitride containing layer proximal the polymer layer.

15. The chip package of claim 13, wherein the polymer layer has a modulus of elasticity in a range from about 0.5 GPa to about 5.0 GPa.

16. The chip package of claim 13, wherein the polymer layer has a coefficient of thermal expansion in a range from about 10 ppm/° C. to about 100 ppm/° C.

17. The chip package of claim 13, further comprising an insulating layer disposed over the polymer layer and surrounding the conductive pillar.

18. The chip package of claim 17, further comprising:
   a first redistribution layer (RDL) over the insulating layer and the conductive pillar; and
   a second RDL over a second side of the chip opposing the first side.

19. The chip package of claim 18, further comprising a conductive via adjacent a sidewall of the chip, wherein the conductive via electrically connects the first RDL to the second RDL.

20. The chip package of claim 9, further comprising a second RDL over a second side of the chip opposing the first side, wherein the conductive via electrically couples the fan-out structure of the first RDL to the second RDL.

* * * * *